United States Patent
Song et al.

(10) Patent No.: US 7,532,143 B2
(45) Date of Patent: May 12, 2009

(54) DEVICE FOR DETECTING VOLTAGE AND ANALOG-TO-DIGITAL CONVERTER (ADC) USING THE SAME

(75) Inventors: In-sang Song, Seoul (KR); Sang-wook Kwon, Seongnam-si (KR); Jung-eun Lee, Yongin-si (KR); Young-tack Houng, Suwon-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 11/979,490

(22) Filed: Nov. 5, 2007

(65) Prior Publication Data

US 2008/0309528 A1    Dec. 18, 2008

(30) Foreign Application Priority Data

Jun. 18, 2007    (KR) .................. 10-2007-0059608

(51) Int. Cl.
*H03M 1/12*    (2006.01)

(52) U.S. Cl. .................................................... 341/155
(58) Field of Classification Search ................. 341/155, 341/158; 257/310, 339; 438/186
See application file for complete search history.

(56) References Cited

U.S. PATENT DOCUMENTS 6,703,819 B2 *    3/2004    Gascoyne et al. .......... 324/71.4
6,943,069 B2 *    9/2005    Halamik et al. ............. 438/186

* cited by examiner

*Primary Examiner*—Peguy JeanPierre
(74) *Attorney, Agent, or Firm*—McNeely Bodendorf LLP

(57) ABSTRACT

A voltage detecting device and an analog-to-digital converter (ADC) using the same are provided. The voltage detecting device determines whether input voltage is higher than threshold voltage based on contact of a strip and a membrane. Therefore, high resolution and high speed operation is possible, but with consuming lower power, and an element capable of performing the function of resistor and comparator is provided. Furthermore, a more effective ADC may be provided using the above.

12 Claims, 11 Drawing Sheets

INPUT RF SIGNAL HAVING VOLTAGE HIGHER THAN THRESHOLD VOLTAGE → NO OUTPUT

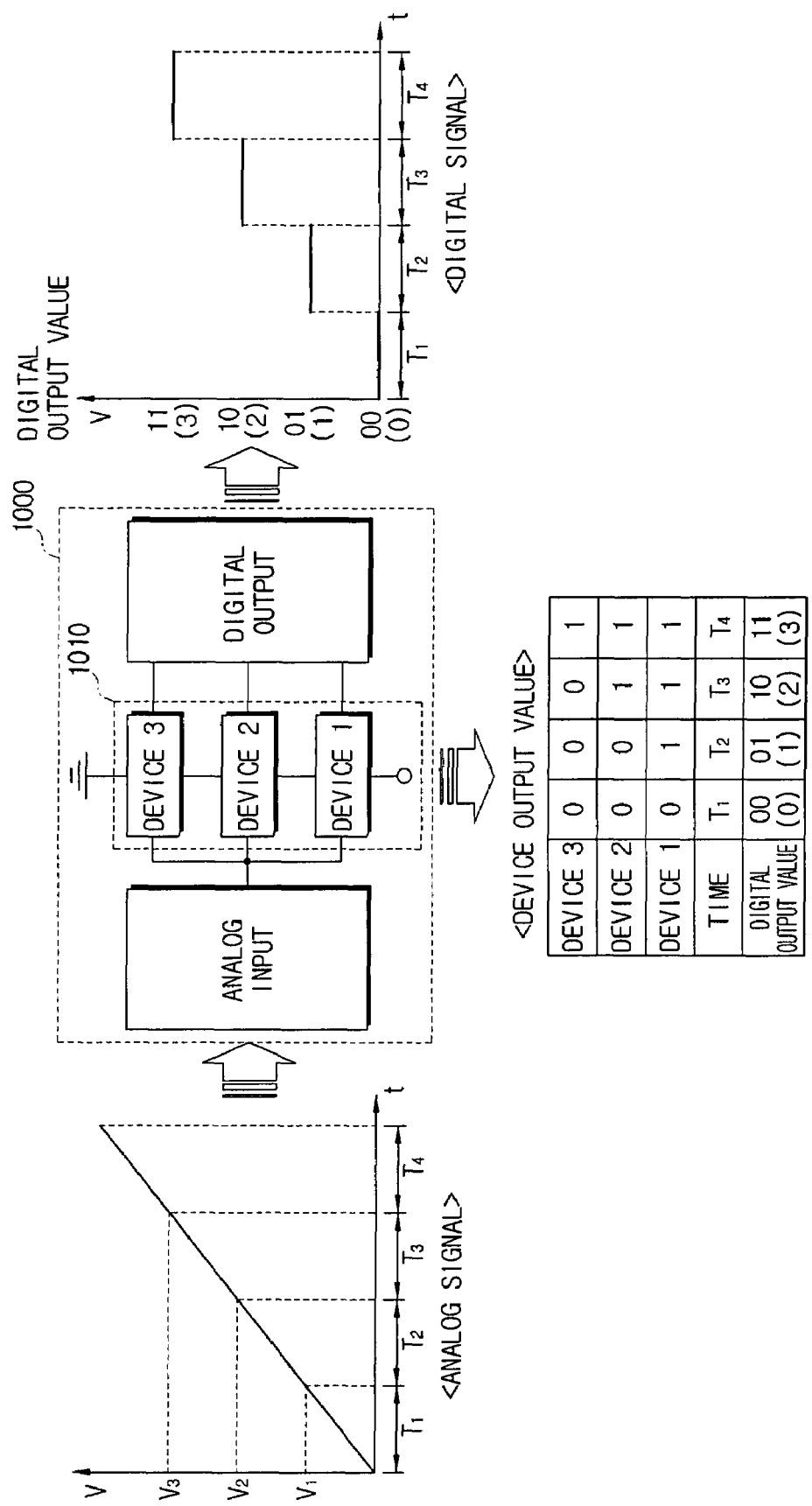

DEVICE FOR DETECTING VOLTAGE AND ANALOG-TO-DIGITAL CONVERTER (ADC) USING THE SAME

CROSS-REFERENCE TO RELATED APPLICATIONS

This application claims the benefit under 35 U.S.C. §119 (a) of Korean Patent Application No. 10-2007-59608, filed Jun. 18, 2007, in the Korean Intellectual Property Office, the entire disclosures of both of which are hereby incorporated by reference.

BACKGROUND OF THE INVENTION

1. Field of the Invention

The present invention relates to a device for detecting voltage and an analog-to-digital converter (ADC) using the same, and more particularly, to a Microelectromechanical System (MEMS) device for detecting voltage and an ADC using the same.

2. Description of the Related Art

Signals naturally change in an analog manner as time passes. It is necessary to know the size of signals according to time to understand natural phenomena. Values of the signal size can be processed and analyzed by a computer program. Since it is required to convert an analog signal into a digital signal to convert an analog signal into a digital signal processable and analyzable by a computer, an analog-to-digital converter (ADC) is generally used for this purpose.

An ADC may be fabricated by Microelectromechanical System (MEMS) technology. The MEMS is also referred to as micro system, micro machine, or micro mechatronics. That is, an ADC may be miniaturized using MEMS technology.

Various types of ADC are available, including a parallel ADC, a single slope ADC, a dual slope integrating ADC, and a successive approximation ADC. The parallel ADC uses an operational amplifier (Op-Amp) as a comparator, and encodes a signal to be output into a binary shape to output the signal in a digital form. If input voltage is higher than reference voltage, the comparator outputs voltage corresponding to logical value 1.

The parallel ADC may comprise a plurality of resistors to set reference voltage, a plurality of comparator to compare voltage with reference voltage, and an encoder to output a digital signal.

If an ADC comprises a plurality of resistors and comparators, the resistors and comparators would consume a great amount of power. But since more resistors and comparators are required to implement High-resolution and High-speed, far more amount of power is consumed.

As an ADC consuming low power is preferred, a device is required to consume lower power, to implement High-resolution and High-speed, and to perform functions of a resistor and a comparator.

SUMMARY OF THE INVENTION

Exemplary embodiments of the present invention address at least the above problems and/or disadvantages and provide at least the advantages described below.

Accordingly, an aspect of the present invention is to provide a voltage detecting device capable of detecting voltage based on contact of a strip, and an analog-to-digital converter (ADC) using the same, in which high resolution and high speed operation is possible, but with consuming lower power, and an element capable of performing the function of resistor and comparator is provided.

In order to achieve the above-described aspects of the present invention, a voltage detecting device is provided, which includes strip; and a membrane spaced apart from the strip at an interval, wherein whether or not input voltage is higher than a threshold voltage is determined by detecting whether or not the strip is contacted with the membrane according to voltage applied between the strip and the membrane.

The device may further include a dielectric slab, wherein the strip is disposed on one surface of the dielectric slab.

The device may further include a first ground and a second ground, wherein the first ground and the second ground are disposed on the same surface as the strip, and contacted with opposite ends of the membrane, respectively.

The strip may form a co-planar waveguide.

The device may further include a third ground of which electrical current flows into ground, wherein the third ground is disposed on a surface opposite to the strip of the dielectric slab.

The strip and membrane may be arranged across each other.

Signal voltage to transfer a signal may be applied to the strip, and a DC voltage may be applied to the membrane.

A part of the strip may be severed, and if voltage higher than the threshold voltage is applied between the strip and the membrane, the strip is contacted with the membrane such that the severed part of the strip is connected with each other.

A first part and a second part of the membrane may include an insulator.

A dielectric may be disposed at an upper portion of the strip.

A part of the membrane may include an insulator.

An analog-to-digital converter (ADC) may comprise a plurality of voltage detecting devices, each comprising a strip; and a membrane spaced apart from the strip at an interval, wherein whether or not input voltage is higher than a threshold voltage is determined by detecting whether or not the strip is contacted with the membrane according to voltage applied between the strip and the membrane may include a plurality of the voltage detecting devices.

BRIEF DESCRIPTION OF THE DRAWINGS

The above and other objects, features and advantages of certain exemplary embodiments of the present invention will be more apparent from the following description taken in conjunction with the accompanying drawing, in which;

FIG. 11 is a view to explain an operation of an analog to digital converter (ADC) having three voltage detecting devices according to another exemplary embodiment of the present invention.

Throughout the drawings, the same drawing reference numerals will be understood to refer to the same elements, features and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
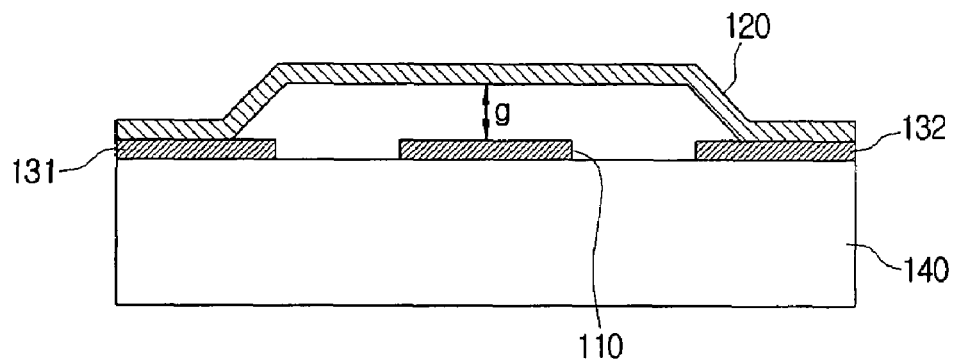
FIGS. 1 and 2 are a sectional side view and a sectional plan view of a voltage detecting device according to a first exemplary embodiment of the present invention.
Figure 2:
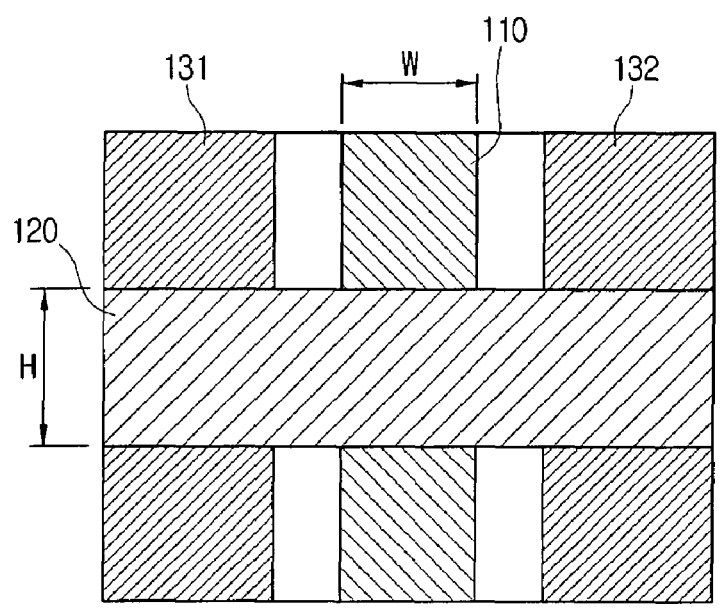

FIGS. 1 and 2 are a sectional side view and a sectional plan view of a voltage detecting device according to a first exemplary embodiment of the present invention.

As illustrated in FIGS. 1 and 2, a voltage detecting device may comprise a strip 110, a membrane 120, a first ground 131, a second ground 132, and a dielectric slab 140.

The strip 110 having width W is disposed on the dielectric slab 140. Signal voltage to transmit a signal may be input to the strip 110, and may be in a radio frequency (RF) signal form. The strip 110 may be a co-planar waveguide. The co-planar waveguide includes conductive transmission lines formed on a dielectric slab. Because the co-planar waveguide does not require a via hole, it is beneficial to reduce fabricating cost, and miniaturize a module.

The membrane 120 has width H, and is apart from the strip 110 at interval (g). The membrane 120 is perpendicular to the strip 110. Opposite ends of the membrane 120 may be contacted with the first ground 131 and the second ground 132, respectively. The direct current (DC) voltage to detect contact with the strip 110 may be input to the membrane 120.

The first and second grounds 131, 132 are disposed on the dielectric slab 140. Electrical current flows into ground, or DC voltage is applied to the first and second grounds 131, 132.

The strip 110, the first ground 131, and the second ground 132 are provided on the same surface of the dielectric slab 140, wherein the strip 110 is the center of waveguide to transmit an electromagnetic wave signal. These structures are referred to as a co-planar waveguide.

If signal voltage is applied to the strip 110 to transmit a signal through the strip 110, the electric potential difference is established between the strip 100 and the membrane 120.

If the electric potential difference is established between two metal plates, the two metal plates are attracted to each other. This attraction is called the electrostatic force. The electrostatic force, or the coulomb's force is one of the basic physical forces. The electrostatic force becomes weaker, if the interval (g) between the two metal plates becomes wider, and the electrostatic force becomes stronger, if the electric potential difference and overlapped area between the two plates become larger.

Threshold voltage is calculated by adjusting the overlapped area (A=W*H) and the interval (g) between the two plates. If voltage below the threshold voltage is applied, the two metal plates are detached from each other, and if voltage over the threshold voltage is applied, the two metal plates are contacted with each other. The threshold voltage may be computed by:

$$Vp=(8\ kg^3/27\epsilon A)^{1/2} \quad\quad\quad\quad \text{[Formula 1]}$$

where, Vp represents a threshold voltage, k represents elastic modulus which is the mathematical description of a membrane's tendency to be deformed elastically (i.e. non-permanently) when a force is applied to it, g represents interval between a strip and the membrane, $\epsilon$ represents a permittivity of medium between the strip and the membrane, and A represents overlapped area (A=W*H) between the strip and the membrane.

The threshold voltage (Vp) can be adjusted according to the interval (g) and the overlapped area (A) between the strip 110 and the membrane 120 as shown above in Formula 1. The voltage detecting device may substitute a reference resistor and a comparator, because it detects whether or not voltage over the threshold voltage (Vp) is applied.

The voltage detecting device according to a first exemplary embodiment of the present invention has been described in detail with reference to FIGS. 1 and 2.

In the first exemplary embodiment of the present invention, the strip 110, the membrane 120, the first ground 131, and the second ground 132 are conductors, but it is merely an exemplary embodiment for convenient explanation. Alternatively, other materials may be used. For example, the strip 110, the membrane 120, the first ground 131, and the second ground 132 may be semiconductors, or theses may be made from different materials, respectively. An insulator or a dielectric may be included in a part of each of the strip 10, the membrane 120, the first ground 131, or the second ground 132.

Other exemplary embodiments of a voltage detecting device will be explained in detail with reference to FIGS. 3A to 9B.

Figure 3A:
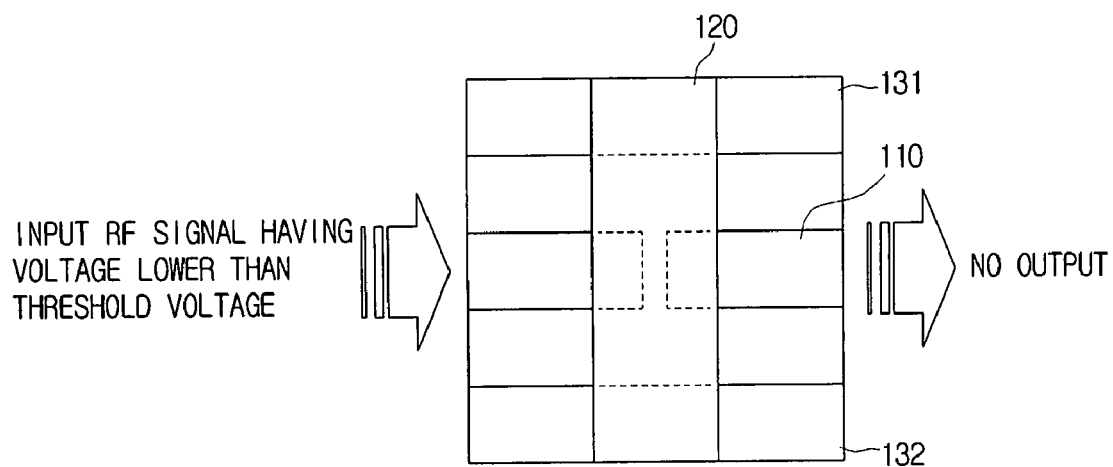
FIGS. 3A and 3B are a sectional plan view and a sectional side view of a voltage detecting device according to a second exemplary embodiment of the present invention when a radio frequency (RF) signal lower than threshold voltage is input.
Figure 3B:
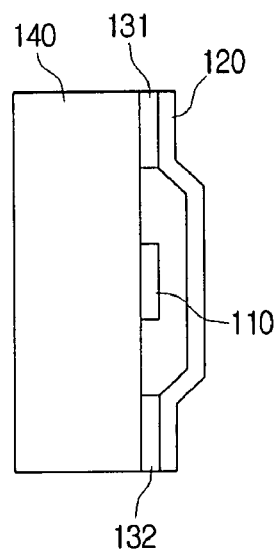
Figure 4A:
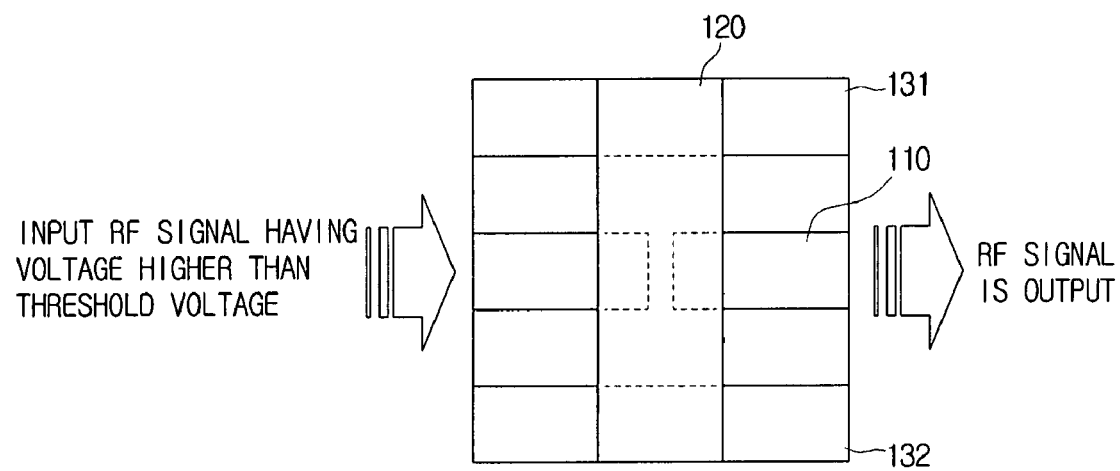
FIGS. 4A and 4B are a sectional plan view and a sectional side view of a voltage detecting device according to the second exemplary embodiment of the present invention when an RF signal having voltage higher than threshold voltage is input.
Figure 4B:
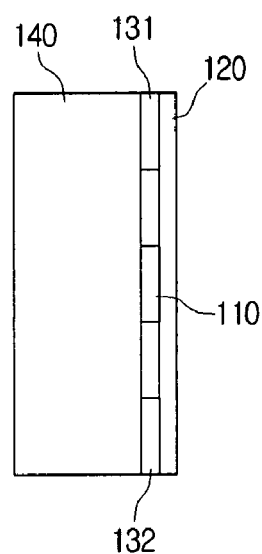

FIGS. 3A and 3B are a sectional plan view and a sectional side view of a voltage detecting device according to a second exemplary embodiment of the present invention when a radio frequency (RF) signal lower than threshold voltage is input, and FIGS. 4A and 4B are a sectional plan view and a sectional side view of a voltage detecting device according to the second exemplary embodiment of the present invention when an RF signal having voltage higher than threshold voltage is input.

The voltage detecting devices illustrated in FIGS. 3A to 4B are similar to that illustrated in FIGS. 1 and 2 and thus a description of like elements will be omitted for the sake of brevity.

FIG. 3A illustrates a voltage detecting device according to the second exemplary embodiment of the present invention wherein the center of the strip 110 is severed. If an RF signal having voltage lower than threshold voltage is applied, the strip 110 is detached from the membrane 120 as illustrated in FIG. 3B. Accordingly, the RF signal input through an input of the strip 110 cannot be output.

On the other hand, if an RF signal having voltage higher than the threshold voltage is applied to the strip 110 as illustrated in FIG. 4A, the membrane 120 is contacted with the strip 110. The RF signal is output from an output of the strip 110 because the severed strip 110 is connected through the membrane 120.

If an output value is not provided from the output of the strip 110, the voltage of the input RF signal is lower than the threshold voltage according to the second exemplary embodiment of the present invention, and if an output value is provided from the output of the strip 110, the voltage of the input RF signal is higher than the threshold voltage. Therefore, it is possible to detect whether the input voltage is higher than the threshold voltage.

Figure 5A:
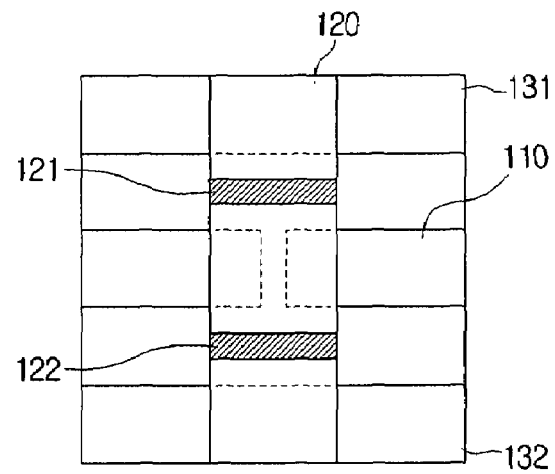
FIGS. 5A and 5B are a sectional plan view and a sectional side view of a voltage detecting device according to a third exemplary embodiment of the present invention.
Figure 5B:
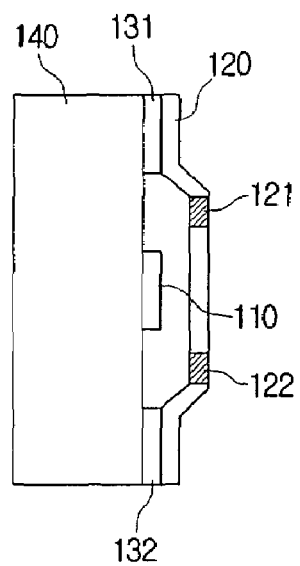

FIGS. 5A and 5B are a sectional plan view and a sectional side view of a voltage detecting device according to a third exemplary embodiment of the present invention. The voltage detecting devices illustrated in FIGS. 5A and 5B are similar to that illustrated in FIGS. 3A to 4B and thus a description of like elements will be omitted for the sake of brevity.

Referring to FIGS. 4A and 4B, if an RF signal having voltage higher than threshold voltage is input to the strip 110, the membrane 120 is contacted with the strip 110. The RF signal of the strip 110 may be leaked through the membrane 120.

In a third exemplary embodiment of the present invention, insulators 121, 122 are inserted to two parts of the membrane 120 as illustrated in FIGS. 5A and 5B. If the insulators 121, 122 are inserted to two parts, with overlapped area of the strip 110 and the membrane 120 being in the middle therebetween, the output of the RF signal through the membrane 120 is prevented. Therefore, voltage is more effectively detected in the third exemplary embodiment than the first exemplary embodiment.

Figure 6A:
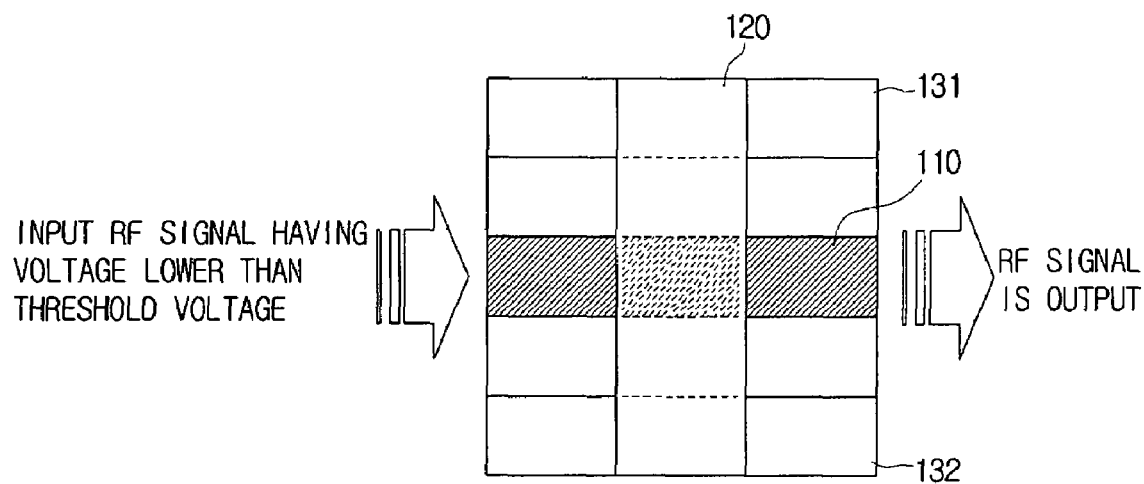
FIGS. 6A and 6B are a sectional plan view and a sectional side view of a voltage detecting device according to a fourth exemplary embodiment of the present invention when an RF signal having voltage lower than threshold voltage is input.
Figure 6B:
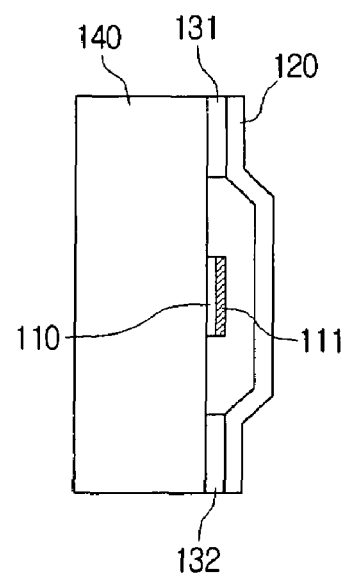
Figure 7A:
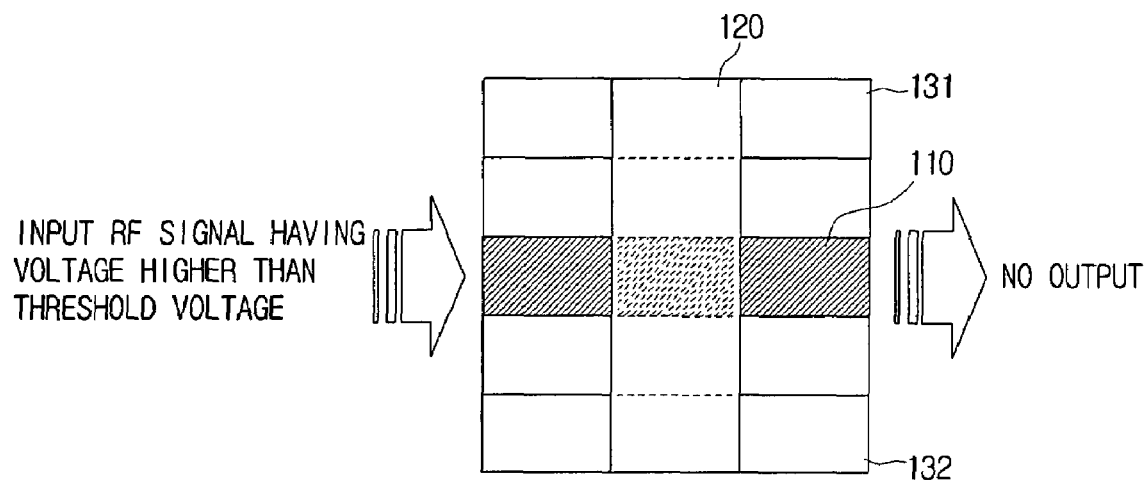
FIGS. 7A and 7B are a sectional plan view and a sectional side view of a voltage detecting device according to a fourth exemplary embodiment of the present invention when an RF signal having voltage higher than threshold voltage is input.
Figure 7B:
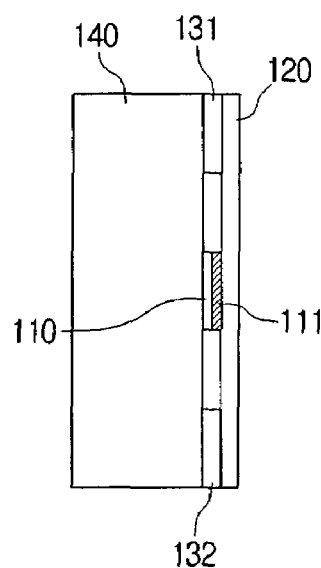

FIGS. 6A and 6B are a sectional plan view and a sectional side view of a voltage detecting device according to a fourth exemplary embodiment of the present invention when an RF signal having voltage lower than threshold voltage is input, and FIGS. 7A and 7B are a sectional plan view and a sectional side view of a voltage detecting device according to a fourth exemplary embodiment of the present invention when an RF signal higher than threshold voltage is input.

Voltage detecting devices of FIGS. 6A to 7B are similar to that illustrated in FIGS. 1 and 2 and thus a description of like elements will be omitted for the sake of brevity.

Referring to FIGS. 6A and 6B, a dielectric 111 is disposed at an upper portion of the strip 110 in the fourth exemplary embodiment.

An RF signal having voltage lower than the threshold voltage is input to the strip 110 as illustrated in FIG. 6A, the membrane 120 is spaced apart from the strip 110 by the interval (g) as illustrated in FIG. 6B. The RF signal is input to the input and output to the output of the strip 110.

Referring to FIG. 7A, if an RF signal having voltage higher than the threshold voltage is input to the strip 110, the membrane 120 is contacted with the strip 110 as illustrated in FIG. 7B. However, because the dielectric 111 is disposed at an upper portion of the strip 110, the interval (g) between the strip 110 and the membrane 120 corresponds to a thickness of the dielectric 111.

The overlapped area between the strip 110 and the membrane 120 operates as a capacitor. As the thickness of the dielectric 111 is so thin, the interval (g) between the strip 110 and the membrane 120 is significantly narrowed. Because capacitance (C) of the capacitor is inversely proportional to the interval (g) between the two metal plates, the amount of capacitance (C) between the strip 110 and the membrane 120 is increased. Also, the input RF signal has a high frequency.

Impedance (Z) of the capacitor is expressed by:

$$Z \propto 1/j\omega C \quad \text{[Formula 2]}$$

where, j represents a complex number, $\omega$ represents an angular frequency, and C represents a capacitance between the strip 110 and the membrane 120.

That is, the impedance (Z) of the capacitor is inversely proportional to the angular frequency ($\omega$) of the input RF signal, and the capacitance (C).

If the very high angular frequency ($\omega$) and capacitance (C) of the RF signal are input to the capacitor, the impedance (Z) of the capacitor is significantly lowered. Consequently, the input RF signal is leaked through the capacitor. The phenomenon which allows electrical current to pass around another point in the circuit is called a shunt.

If the membrane 120 is contacted with the strip 110 as illustrated in FIG. 7B, the interval (g) between the strip 110 and the membrane 120 is narrowed. So, the amount of the capacitance between the strip 110 and the membrane 120 is increased, and the input RF signal also has a high frequency.

If the RF signal higher than the threshold voltage is input to the strip 110, the RF signal is leaked to the membrane 120 by the shunt phenomenon. Therefore, the RF signal is not output to the output of the strip 110.

If an output value is detected at the output of the strip 110, the input RF signal is lower than the threshold voltage, and if the output value is not detected, the input RF signal is higher than the threshold voltage, according to the fourth exemplary embodiment of the present invention. Consequently, whether the voltage of the RF signal is higher than the threshold voltage is determined.

Figure 8A:
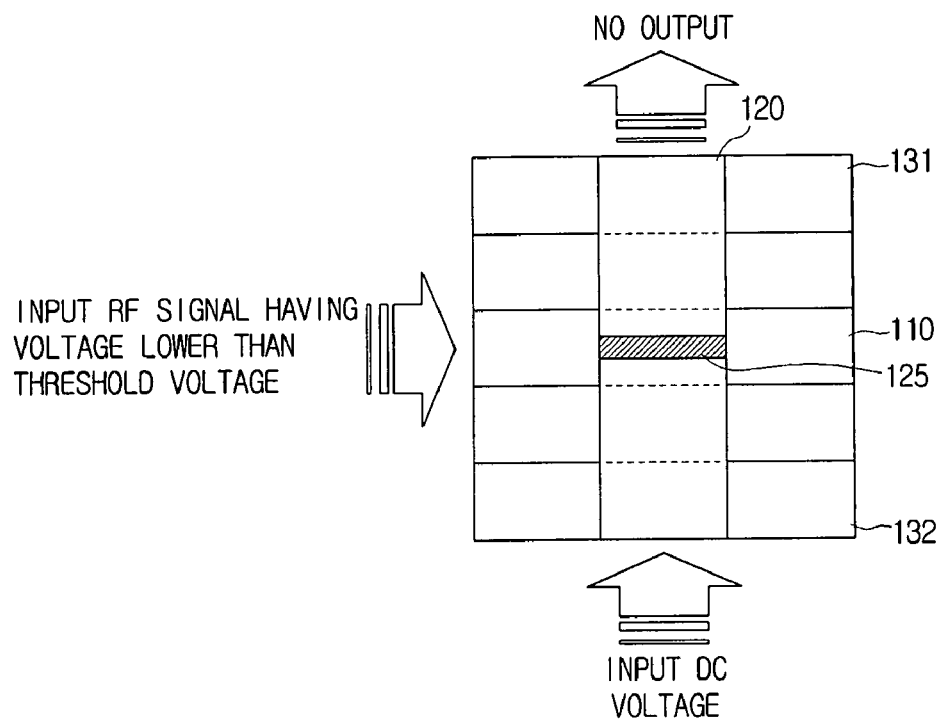
FIGS. 8A and 8B are a sectional plan view and a sectional side view of a voltage detecting device according to a fifth exemplary embodiment of the present invention when an RF signal having voltage lower than threshold voltage is input.
Figure 8B:
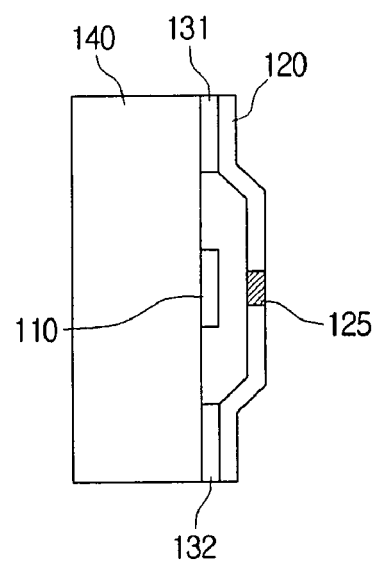
Figure 9A:
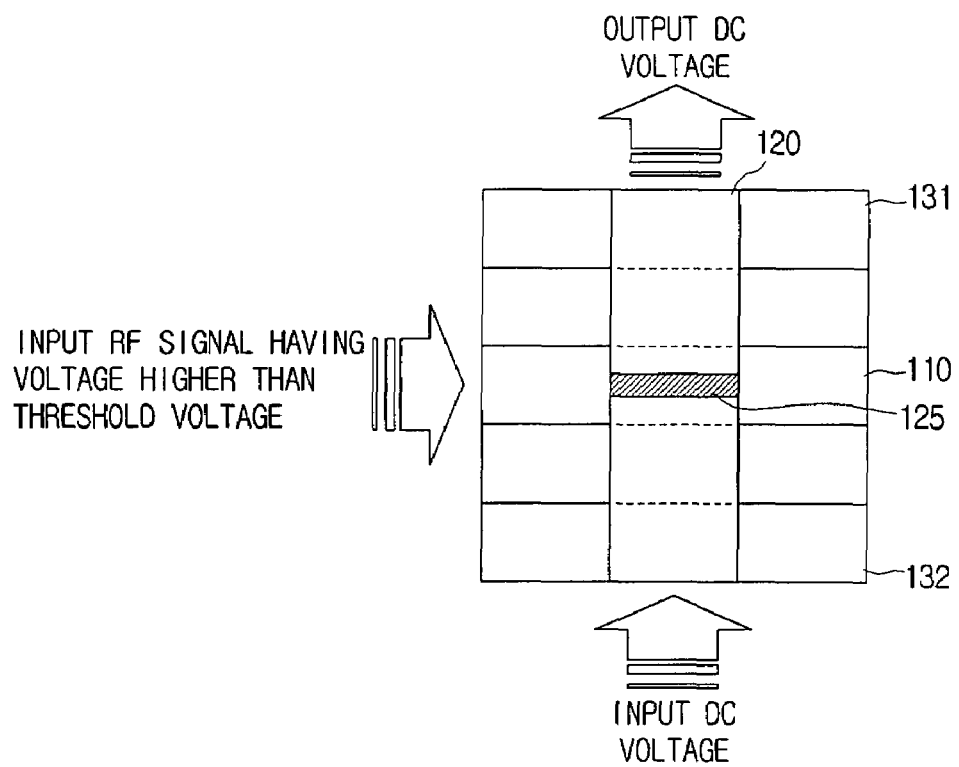
FIGS. 9A and 9B are a sectional plan view and a sectional side view of a voltage detecting device according to a fifth exemplary embodiment of the present invention when an RF signal having voltage higher than threshold voltage is input.
Figure 9B:
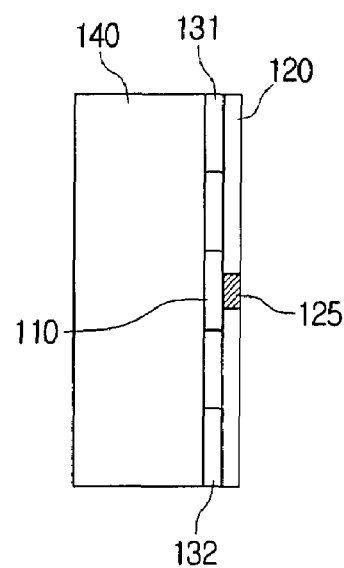

FIGS. 8A and 8B are a sectional plan view and a sectional side view of a voltage detecting device according to a fifth exemplary embodiment of the present invention when an RF signal having voltage lower than threshold voltage is input, and FIGS. 9A and 9B are a sectional plan view and a sectional side view of a voltage detecting device according to a fifth exemplary embodiment of the present invention when an RF signal higher than threshold voltage is input.

The voltage detecting devices illustrated in FIGS. 8A to 9B are similar to that illustrated in FIGS. 1 and 2, and thus a description of like elements will be omitted for the sake of brevity.

As illustrated in FIGS. 8A and 9B, an insulator 125 is disposed at the center of the membrane 120 in a fifth exemplary embodiment of the present invention, and DC voltage is applied to the membrane 120.

If an RF signal having voltage lower than the threshold voltage is input to the strip 110 as illustrated in FIG. 8A, the membrane 120 is spaced apart from the strip 110 by an interval (g) as illustrated in FIG. 8B. The DC voltage input to the membrane 120 is not transferred due to the insulator 125, such that the DC voltage is not output to the output of the membrane 120.

If an RF signal having voltage higher than the threshold voltage is input to the strip 110 as illustrated in FIG. 9A, the membrane 120 is contacted with the strip 110 as illustrated in FIG. 9B. A part of the membrane 120 wherein the insulator 125 is disposed is contacted to the strip 110. Accordingly, the DC voltage input to the membrane 120 is output to the output of the membrane 120.

According to the fifth exemplary embodiment of the present invention, if the output value is not provided from the output of the membrane 120, the input RF signal is lower than the threshold voltage, and if the output value is detected at the output of the membrane 120, the input RF signal is higher than the threshold voltage. Accordingly, whether the input voltage is higher than the threshold voltage is detected.

Figure 10A:
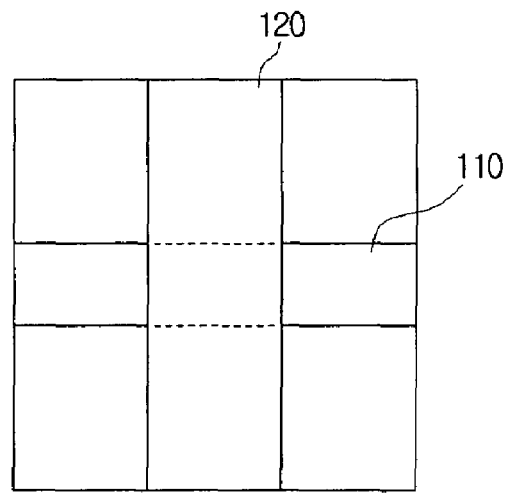
FIGS. 10A and 10B a sectional plan view and a sectional side view of a voltage detecting device of another structure according to a sixth exemplary embodiment of the present invention.
Figure 10B:
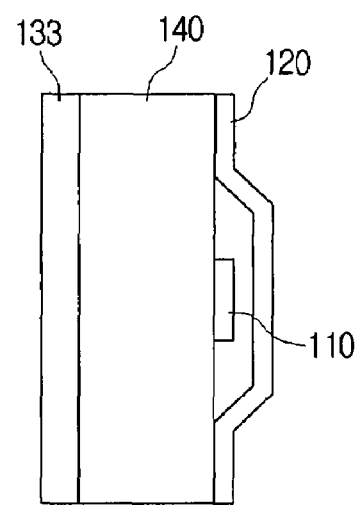

FIGS. 10A and 10B a sectional plan view and a sectional side view of a voltage detecting device of another structure according to a sixth exemplary embodiment of the present invention.

A voltage detecting devices of FIGS. 10A and 10B are similar to that illustrated in FIGS. 1 and 2 and thus a description of like elements will be omitted for the sake of brevity.

Referring to FIG. 10, a voltage detecting device according to the sixth exemplary embodiment of the present invention comprises a third ground 133 instead of the first and second grounds 131, 132. Referring to FIG. 10B, the third ground 133 is disposed on a surface opposite to the strip 110 of the dielectric slab 140.

The voltage detecting device as illustrated FIGS. 10A and 10B may also be implemented as to operate the same function as that of the first exemplary embodiment of the present invention.

A process of detecting voltage is described with reference to the second to sixth exemplary embodiments of the present, but it is merely exemplary embodiments of the present invention. Alternatively, it may be implemented to detect voltage using other methods.

The operation of ADC according to yet another exemplary embodiment of the present invention will be explained in detail with reference to FIGS. 11 and 12.

FIG. 11 is a view to explain the operation of an analog to digital converter (ADC) having three voltage detecting devices according to yet another exemplary embodiment of the present invention.

Referring to FIG. 11, an ADC 1000 needs three voltage detecting devices 1010 to acquire 2-bit digital output value.

The graphical representation in FIG. 11 shows analog signals having voltage V1, V2, V3 input during time intervals T1 to T4 and increase proportionally.

The devices 1, 2, 3 correspond to the voltage detecting devices of the second exemplary embodiment of the present invention. The threshold voltage of devices 1, 2, 3 is represented as V1, V2, V3, respectively.

If voltage of an analog input signal is lower than V1 as in the time interval T1, none of the devices 1, 2, 3 outputs values. If voltage of an analog input signal is V1 to V2 as in the time interval T2, one device 1 outputs a value, and two devices 2, 3 do not output values. If voltage of an analog input signal is V2 to V3 as in the time interval T3, two devices 1, 2 output values, and one device 3 does not output a value. And, if voltage of an analog input signal is higher than V3 as in the time interval T4, all the devices 1, 2, 3 output values.

The output values of the devices 1 to 3 are converted into digital output values through an encoder (not illustrated). That is, if the three devices 1 to 3 output values (0, 0, 0), the digital output value may be 00, if these devices 1 to 3 output values (0, 0, 1), the digital output value may be 01, if these devices 1 to 3 output values (0, 1, 1), the digital output value may be 10, and if these devices 1 to 3 output values (1, 1, 1), the digital output value may be 11.

The digital output values of the time intervals T1 to T4 can be expressed in a graphical form, as in a digital signal graph of FIG. 11. Accordingly, an ADC that represents 2-bit using three devices may be implemented.

Figure 12:
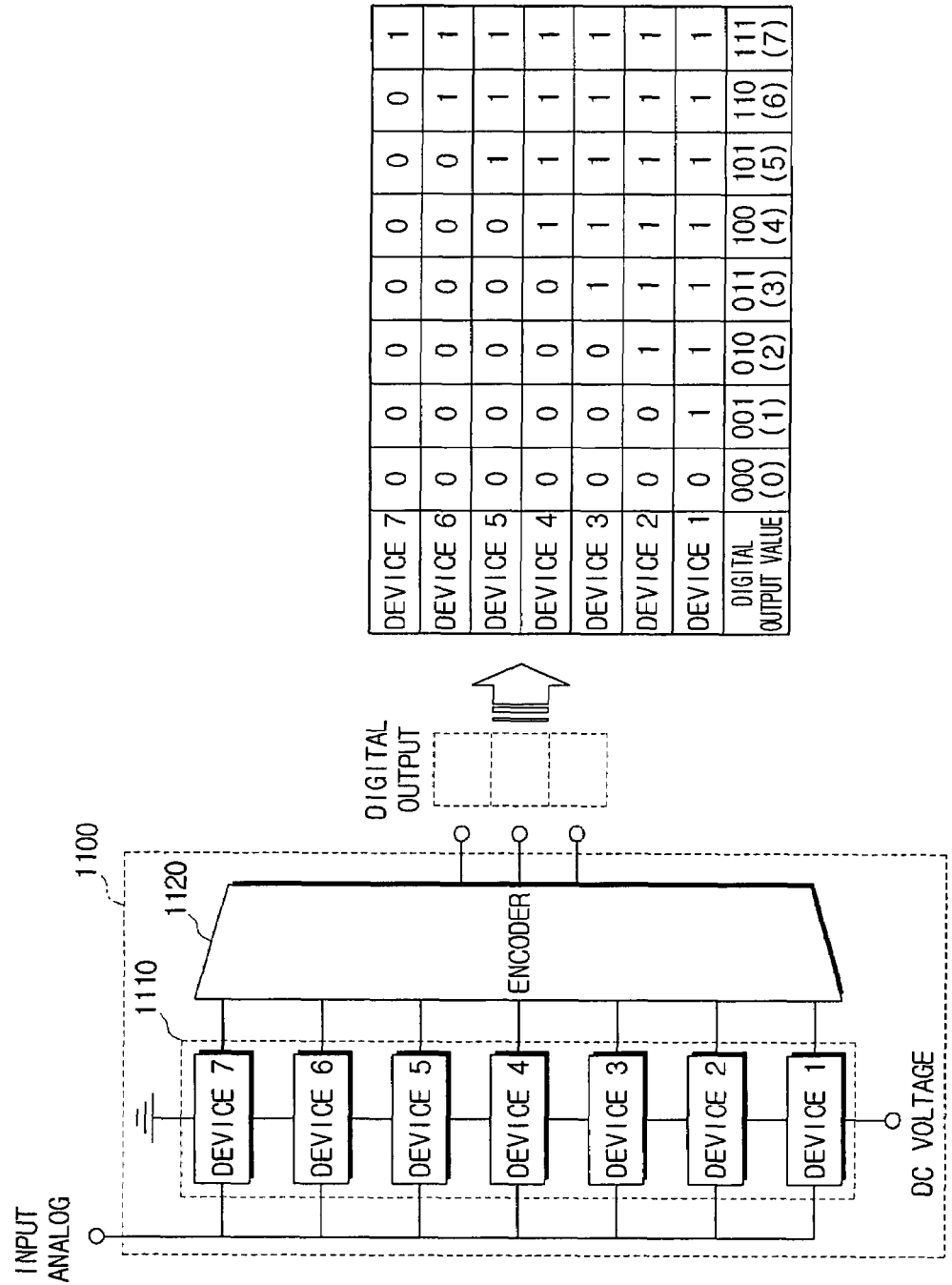
FIG. 12 is a view to explain the operation of an ADC having seven voltage detecting devices according to yet another exemplary embodiment of the present invention.

FIG. 12 is a view to explain the operation of an ADC having seven voltage detecting devices according to yet another exemplary embodiment of the present invention.

Referring to FIG. 12, an ADC 1100 may comprise a plurality of voltage detecting devices 1110, and an encoder 1120.

Each of voltage detecting devices 1110 in sequence has higher threshold voltage than a voltage detecting device 1110 before it. Because the plurality of voltage detecting devices 1110 determine reference voltages respectively, the plurality of voltage detecting devices 1110 may operate as a reference resistor. Additionally, because each of the devices 1110 can detect whether the input voltage is higher than the threshold reference voltage, the devices 1110 may also operate as a comparator.

The encoder 1120 converts signals output from the plurality of voltage detecting devices 1110 into digital form. For example, if seven voltage detecting devices 1110 are provided, (0, 0, 0, 0, 0, 0, 0) is converted into 000, (0, 0, 0, 0, 0, 0, 1) is converted into 001, (0, 0, 0, 0, 0, 1, 1) is converted into 010, (0, 0, 0, 0, 1, 1, 1) is converted into 011, (0, 0, 0, 1, 1, 1, 1) is converted into 100, (0, 0, 1, 1, 1, 1, 1) is converted into 101, (0, 1, 1, 1, 1, 1, 1) is converted into 110, and (1, 1, 1, 1, 1, 1, 1) is converted into 111.

An ADC to output 3-bit digital values may be implemented using the plurality of voltage detecting devices 1110, and the encoder 1120.

The ADC to output 2-bit and 3-bit digital values has been described in detail with reference FIGS. 11 and 12, however it is merely exemplary embodiment of the present invention. Alternatively, an ADC to output other bits of digital values may also be implemented. For example, an ADC to output 4-bit digital values may be implemented using 15 voltage detecting devices, or an ADC to output 5-bit digital values may be implemented using 31 voltage detecting devices.

As described above, a voltage detecting device to detect voltage based on contact of a strip, and an ADC using the same are provided, such that high resolution and high speed operation is possible, but with consuming lower power, and an element capable of performing the function of resistor and comparator is provided. Furthermore, a more effective ADC may be provided using the above.

Furthermore, because voltage detecting device does not require a resistor or a comparator, it almost does not consume power.

Furthermore, an ADC is implemented using a voltage detecting device and an encoder such that the ADC is miniaturized and simplified.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A voltage detecting device comprising:
   a strip; and
   a membrane spaced apart from the strip at an interval,
   wherein whether or not input voltage is higher than a threshold voltage is determined by detecting whether or not the strip is contacted with the membrane according to voltage applied between the strip and the membrane.

2. The device of claim 1, further comprising:
a dielectric slab,
wherein the strip is disposed on one surface of the dielectric slab.

3. The device of claim 2, further comprising:
a first ground and a second ground,
wherein the first ground and the second ground are disposed on the same surface as the strip, and contacted with opposite ends of the membrane, respectively.

4. The device of claim 3, wherein the strip forms a coplanar waveguide.

5. The device of claim 2, further comprising:
a third ground,
wherein the third ground is disposed on a surface opposite to the strip of the dielectric slab.

6. The device of claim 1, wherein the strip and membrane are arranged across each other.

7. The device of claim 1, wherein a signal voltage to transfer a signal is applied to the strip, and a DC voltage is applied to the membrane.

8. The device of claim 1, wherein a part of the strip is severed, and if voltage higher than the threshold voltage is applied between the strip and the membrane, the strip is contacted with the membrane such that the severed part of the strip is connected with each other.

9. The device of claim 1, wherein a first part and a second part of the membrane comprise an insulator.

10. The device of claim 1, wherein a dielectric is disposed at an upper portion of the strip.

11. The device of claim 1, wherein a part of the membrane comprises an insulator.

12. A analog-to-digital converter (ADC), comprising:
a plurality of voltage detecting devices, each comprising:
a strip; and
a membrane spaced apart from the strip at an interval,
wherein whether or not input voltage is higher than a threshold voltage is determined by detecting whether or not the strip is contacted with the membrane according to voltage applied between the strip and the membrane.

* * * * *